US006786708B2

(12) United States Patent
Brown et al.

(10) Patent No.: US 6,786,708 B2
(45) Date of Patent: Sep. 7, 2004

(54) LAMINATED DEVICES AND METHODS OF MAKING SAME

(75) Inventors: Richard B. Brown, Ann Arbor, MI (US); Steve M. Martin, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 5 days.

(21) Appl. No.: 10/198,540

(22) Filed: Jul. 18, 2002

(65) Prior Publication Data

US 2004/0013545 A1 Jan. 22, 2004

(51) Int. Cl.[7] .......................... F04B 17/00; F16K 31/02
(52) U.S. Cl. ............................. 417/413.3; 251/129.15; 251/129.16
(58) Field of Search .................... 417/413.2, 413.3; 251/129.15, 129.16

(56) References Cited

U.S. PATENT DOCUMENTS

| | | | | |
|---|---|---|---|---|
| 4,216,477 A | * | 8/1980 | Matsuda et al. ......... | 417/413.3 |
| 4,581,624 A | * | 4/1986 | O'Connor .............. | 251/129.06 |
| 5,074,947 A | | 12/1991 | Estes et al. | |
| 6,116,863 A | | 9/2000 | Ahn et al. | |
| 2002/0086149 A1 | * | 7/2002 | Swartz et al. ............ | 428/215 |

OTHER PUBLICATIONS

Poplawski, et al., A Simple Packaging Process for Chemical Sensors, Solid–State Sensor and Actuator Workshop, Hilton Head, South Carolina, Jun. 13–16, 1994.
Poplawski, M.E., et al., A Simple Packaging Process for Chemical Sensors, Solid–State Sensor And Actuator Workshop, Hilton Head, South Carolina, Jun. 13–16, 1994.
Morrissey, A, Et al., Low–Stress 3D Packaging of A Microsystem, Elsevier Science S.A., 1998.
Martel, Sylvain, et al., A Board–Level Electro–Microfluidic Systems Fabrication Process Based On Electronic Design Methodolgy, IEEE–EMBS Special Topic Conference on Microtechnologies in Medicine & Biology, Lyon, France, Oct. 12–14, 2000.

Menz, A, et al., FLUIDIC Components Based on Ferrofluids, International IEEE–EMBS Special Topic Conference on Microtechnologies in Medicine & Biology, Lyon, France, Oct. 12–14, 2000.
Nguyen, Nam–Trung, et al., Microfluidic Devices Based On PCT–Technology, School of Mechanical and Production Engineering, Nanyang Technological University, Singapore.
Zou, Quanbo, et al., Surface Tension Driven Flow In Micro Channels, Institute of Microelectronics, Singapore.
Gong, Qiulian, et al., Design, Optimization And Simulation on Microelectromagnetic Pump, Elsevier Science S.A., 2000, pp. 200–207.
Folta, James A., et al., Design, Fabrication and Testing of A Miniature Peristaltic Membrane Pump, Lawrence Livermore National Laboratory, livermore, California, IEEE, 1992, pp. 186–189.
Zhang, Mingsheng, et al., A Micromachined Permanent Magnetic Actuator, Information Storage Research Center, Shanghai Jiao Tong University, Shanghai, China, pp. 695–699.
Richter, Stefan, et al., Fabrication of Micro–Fluidic Devices Using PCB–Technology, Department of Electrical Engineering and Information Technology, University of Rostock, Rostock, Germany, pp. 106–114.
Nguyen, Nam–Trung, et al., Miniature Valveless Pumps Based on Printed Circuit Board Technique, Elsevier Science S.A., 2001, pp. 104–111.
Sadler Daniel J., et al., A Universal Electromagnetic Microactuator Using Magnetic Interconnection Concepts, IEEE, 2000; pp. 460–468.

* cited by examiner

Primary Examiner—Charles G. Freay
(74) Attorney, Agent, or Firm—Brooks Kushman P.C.

(57) ABSTRACT

Laminated devices and methods of making same are provided. A fluidic channel is formed in the inner layers of a laminate such as multilayer printed circuit board (PCB) and a hole is opened to the outer layers to allow fluid's access to a chip which contains chemical sensors. Several diaphragms are formed on each side of the chip access hole using the PCB as their substrate. Electromagnetic actuation of these diaphragms by solenoids housed inside the PCB drives or pumps fluid through the channel in a peristaltic fashion. By employing various channel geometries and/or the deposition of hydrophobic/hydrophillic layers, valves are provided in the channels.

23 Claims, 4 Drawing Sheets

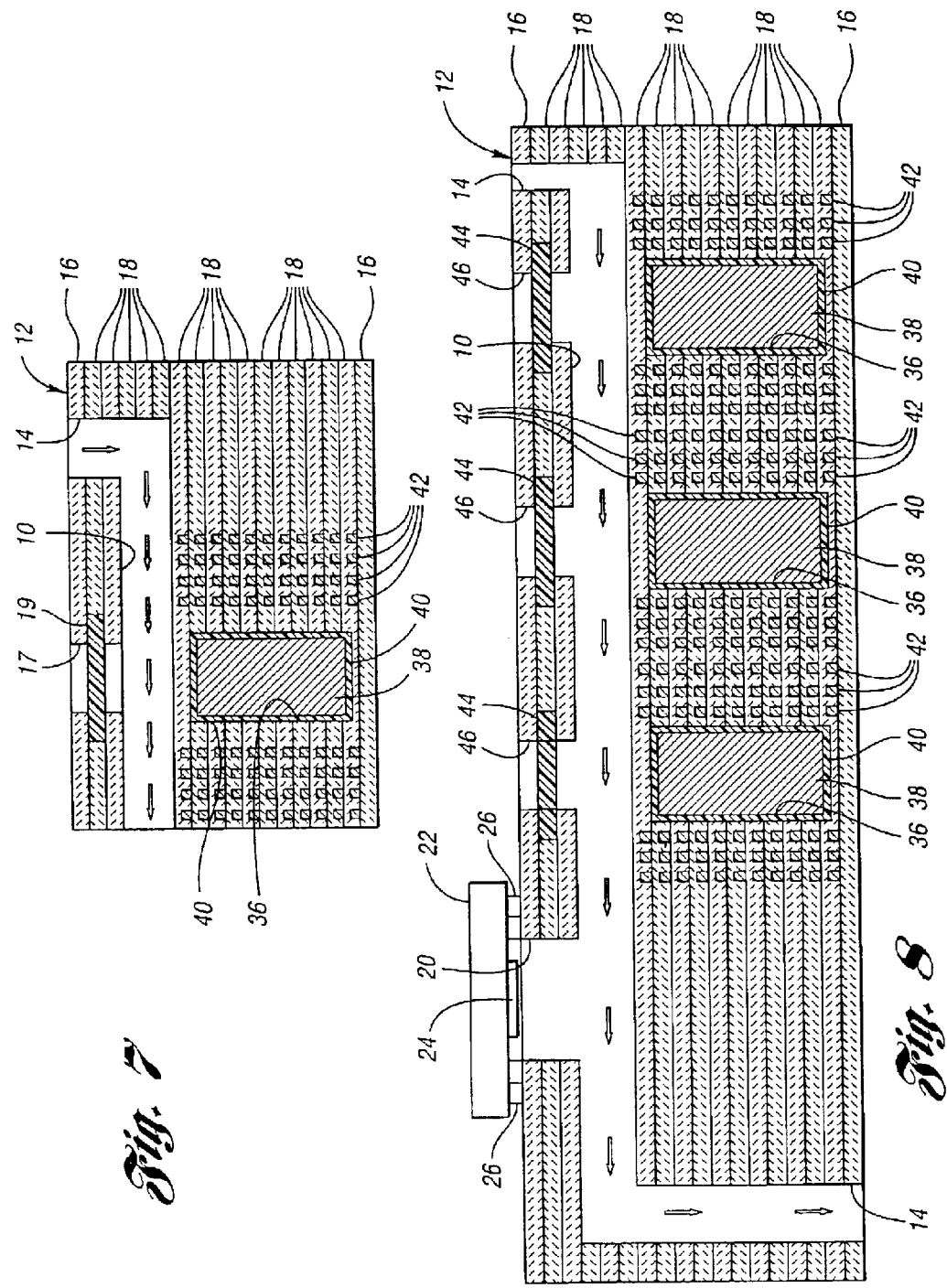

LAMINATED DEVICES AND METHODS OF MAKING SAME

BACKGROUND OF THE INVENTION

1. Field of the Invention

This invention relates to laminated devices and methods of making same.

2. Background Art

Nominally, microchannels can be defined as channels whose dimensions are less than 1 mm and greater than 1 μm. Above 1 mm, the flow exhibits behavior that is the same as most macroscopic flows. Below 1 μm, the flow is better characterized as nanoscopic. Currently, most microchannels fall into the range of 30 to 300 μm. Microchannels can be fabricated in many materials—glass, polymers, silicon and metals using various processes including surface micromachining, bulk micromachining, molding, embossing and conventional machining with microcutters.

One type of mechanical micropump is the positive-displacement pump. These are mechanical pumps with a membrane or diaphragm actuated in a reciprocating mode and with unidirectional inlet and outlet valves. They work on the same physical principle as their larger cousins. Micropumps with piezoelectric actuators have been fabricated. Other actuators such as thermopneumatic, electrostatic, electromagnetic or bimetallic can be used. These exceedingly minute positive-displacement pumps require even smaller valves, seals and mechanisms, a not-too-trivial micromanufacturing challenge. In addition, there are long-term problems associated with wear or clogging and consequent leaking around valves. The pumping capacity of these pumps is also limited by the small displacement and frequency involved. Gear pumps are a different kind of positive-displacement device.

U.S. Pat. No. 6,116,863 to Ahn et al. discloses a micro-actuated device and method of making the same in which an electromagnetic driver, overlapping a magnetically permeable diaphragm, is utilized to drive the microactuated device. The electromagnetic driver is used to provide the motive force for a microactuated device, which may be a micropump, microvalve, and the like. The electromagnetic driver is overlapped over a diaphragm.

U.S. Pat. No. 5,074,947 discloses a flip-chip bonding technique for bonding pads of a flip-chip with pads of a substrate.

The following papers are also related to the present invention:

1) "A Board-Level Electro-Microfluidic Systems Fabrication Process Based on Electronic Design Methodology" by S. Martel, J. Au and I. Hunger, 1ST ANNUAL INTERNATIONAL IEEE-EMBS SPECIAL TOPIC CONFERENCE ON MICROTECHNOLOGIES IN MEDICINE & BIOLOGY, pp. 316–321, Oct. 12–14, 2000, Lyon, France;

2) "Fluidic Components Based on Ferrofluids" by A. Menz, W. Benecke, R. Pérez-Castillejos, J. A. Plaza, J. Esteve, N. Garcia, J. Higuero and T. Díez-Caballero, 1ST ANNUAL INTERNATIONAL IEEE-EMBS SPECIAL TOPIC CONFERENCE ON MICROTECHNOLOGIES IN MEDICINE & BIOLOGY, pp. 302–306, Oct. 12–14, 2000, Lyon, France;

3) "A Simple Packaging Process for Chemical Sensors" by M. E. Poplawski, R. W. Hower and R. B. Brown, SOLID-STATE SENSOR AND ACTUATOR WORKSHOP, Hilton Head, S.C., Jun. 13–16, 1994; and 4) "Low-Stress 3D Packaging of a Microsystem" by A. Morrissey, G. Kelly and J. Alderman, SENSORS AND ACTUATORS A 68 (1998), pp. 404–409.

SUMMARY OF THE INVENTION

An object of the present invention is to provide improved laminated devices and methods of making same.

In carrying out the above object and other objects of the present invention, a microactuated device of the sandwich type is provided. The device includes a substrate having outer insulating layers and inner insulating layers sandwiched between the outer insulating layers. An electromagnetic inductor is housed within the inner insulating layers between the outer insulating layers to produce a magnetic field. A diaphragm is coupled to one of the insulating layers so that forces exerted by the magnetic field cause movement of the diaphragm.

The substrate may be a laminate such as multilayer circuit board.

The inductor may be a solenoid.

The solenoid may include electrically conductive traces disposed on at least one of the inner insulating layers or on a plurality of the inner insulating layers.

The solenoid may also include a magnetic core surrounded by the traces.

The device may further include a fluid channel formed in at least one of the inner insulating layers, and a pump chamber formed in one of the insulating layers in fluid communication with the fluid channel. The diaphragm may be movable between first and second operative positions to vary the volume of the pump chamber.

The device may further include a plurality of electromagnetic inductors housed within the inner insulating layers between the outer insulating layers to produce corresponding magnetic fields and a plurality of diaphragms coupled to one of the insulating layers so that magnetic forces exerted by their respective magnetic fields causes movement of the diaphragms. The device may further include pump chambers formed in one of the insulating layers in fluid communication with the fluid channel wherein each of the diaphragms is movable between first and second operative positions to vary the volume of its respective pump chamber.

The device may further include a valve chamber formed in one of the insulating layers in fluid communication with the fluid channel wherein the diaphragm is movable between first and second operative positions within the valve chamber to operate as a valve.

The device may further include a channel opening formed through a first outer insulating layers and in fluid communication with the fluid channel.

The device may further include a sensor opening formed through a first outer insulating layer and in fluid communication with the fluid channel and a microsensor supported on the first outer insulating layer over the sensor opening which fluidly communicates the microsensor with the fluid channel.

The device may further include a plurality of separate fluid channels formed in at least one of the inner insulating layers.

The fluid channel may have different channel portions and a pair of the channel portions may be defined by hydrophillic material which are fluidly communicated by a channel portion defined by hydrophobic material to form a valve.

The microactuator may be completely housed within the inner insulating layers between the outer insulating layers.

The fluid channel may be shaped to form a slope-based valve therein.

Further in carrying out the above object and other objects of the present invention, a sandwich type device having a microchannel formed therein is provided. The device includes a substrate having outer insulating layers and inner insulating layers sandwiched between the outer insulating layers. A microchannel is formed in at least one of the inner insulating layers between the outer insulating layers.

The microchannel may be formed in a plurality of the inner insulating layers.

The substrate may be a laminate such as multilayer circuit board.

The device may further include one or more pump chambers formed in one of the insulating layers in fluid communication with the microchannel.

The device may further include a valve chamber formed in one of the insulating layers in fluid communication with the microchannel.

The device may further include a channel opening formed through a first outer insulating layer and in fluid communication with the microchannel.

The device may further include a sensor opening formed through a first outer insulating layer and in fluid communication with the microchannel and a microsensor supported on the first outer insulating layer over the sensor opening which fluidly communicates the microsensor with the microchannel.

The device may further include a plurality of separate microchannels formed in at least one of the inner insulating layers.

The microchannel may have different channel portions. A pair of the channel portions may be defined by hydrophillic material which are fluidly communicated by a channel portion defined by hydrophobic material to form a valve.

The microchannel may be shaped to form a slope-based valve therein.

Still further in carrying out the above object and other objects of the present invention, a method of making a sandwich-type, laminated device having a microchannel formed therein is provided. The method includes providing a plurality of insulating layers, and removing a section of at least one of the insulating layers to form at least one inner insulating layer having an elongated slot formed therein. The method also includes assembling the insulating layers to form a stack of insulating layers wherein the at least one inner insulating layer with the elongated slot is sandwiched between outer insulating layers to form the microchannel. The method further includes bonding the stack of insulating layers together to form the sandwich-type, laminated device with the microchannel therein.

The step of bonding may include the step of heating and pressing the stack of insulating layers together.

The method may further include removing a section of one of the insulating layers to form a sensor opening in one of the outer insulating layers. The step of assembling may include the step of aligning the sensor opening with the elongated slot so that the elongated slot is in fluid communication with the sensor opening.

The method may further include flip-chip mounting a microsensor over the sensor opening so that the microsensor is in fluid communication with the microchannel.

The microsensor may have at least one electrical contact and wherein the method may further include sealing the at least one electrical contact from any fluid in the microchannel.

The step of removing may form a slope-based valve in the microchannel.

The above object and other objects, features, and advantages of the present invention are readily apparent from the following detailed description of the best mode for carrying out the invention when taken in connection with the accompanying drawings.

BRIEF DESCRIPTION OF THE DRAWINGS

FIG. 7 is a sectional view of a solenoid, a diaphragm and channel opening formed in the layers of the PCB;

FIG. 8 is a sectional view of a peristaltic pump formed in the multiple layers of the PCB and a sensor chip flip-chip bonded at the outer surface of an outer layer of the PCB;

DETAILED DESCRIPTION OF THE PREFERRED EMBODIMENTS

One aspect of the present invention relies on the fact that modern laminates including PCBs consist of multiple layers of a chosen substrate or multiple types of substrates. The inner layers in the designed laminate of the present invention are used as a hollow channel through which fluid can flow. MCM-L (i.e., multichip module-laminant) technology has been developing wherein virtually any sheet of material such as magnetically permeable materials, flexible materials, rigid materials, hydrophobic layers, hydrophilic layers, etc. may be bonded in a stack in a standard manufacturing process.

Figure 1:
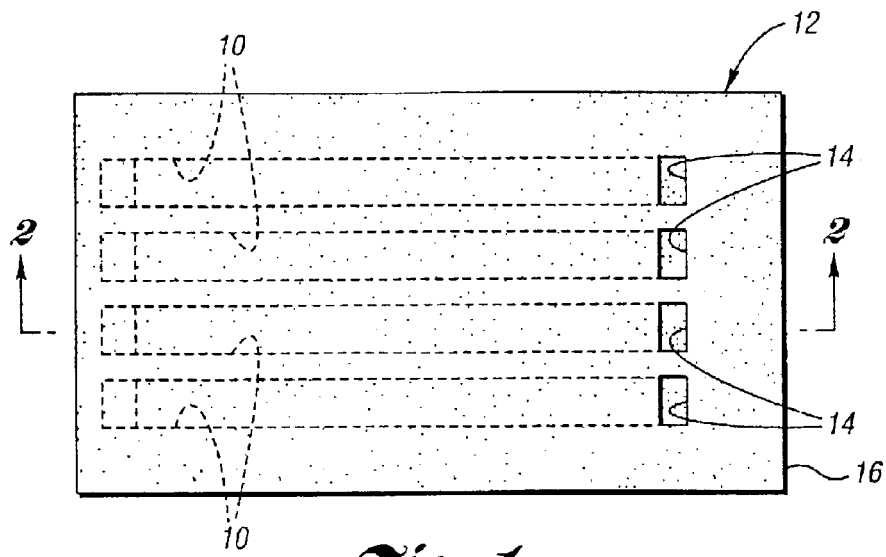
FIG. 1 is a top plan view of a multilayer laminate such as a printed circuit board (PCB) having multiple fluid channels, indicated by phantom lines, formed in inner layers of the PCB in accordance with the present invention.
Figure 2:
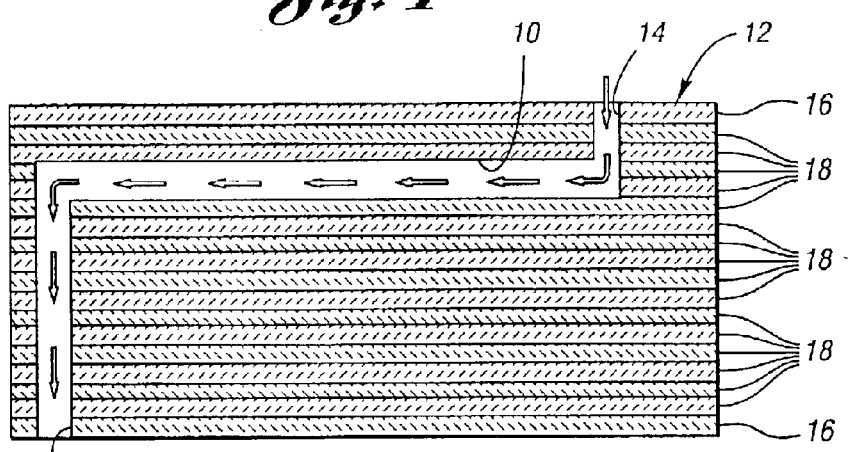
FIG. 2 is a sectional view taken along line 2—2 in FIG. 1 and illustrating one of the fluid channels and the multiple layers of the PCB.

Assume a PCB consists of n layers of substrate with layer (0) indicating the top layer and layer (n) indicating the bottom layer. By photolithographic or milling operations, a section of a particular layer can be etched or machined away. Now by repeating this for all layers (i) through layers (i+j) where i>0 and (i+j)<n, and fastening the layers together in a typical laminate or PCB manufacturing method, multiple channels 10 are formed inside a PCB 12, as shown in FIGS. 1 and 2. While FIG. 2 shows a large number of layers 18, only a few layers 18 are also contemplated by the present invention. The channels 10 may be completely independent as shown in the Figures, or they may be interconnected in various fashions to produce a complex network of fluidic channels. Holes 14 in outer layers 16 are also opened which allow fluid (indicated by arrows) to enter and exit the channel 10 formed in inner layers 18 of the PCB 12.

Figure 3:
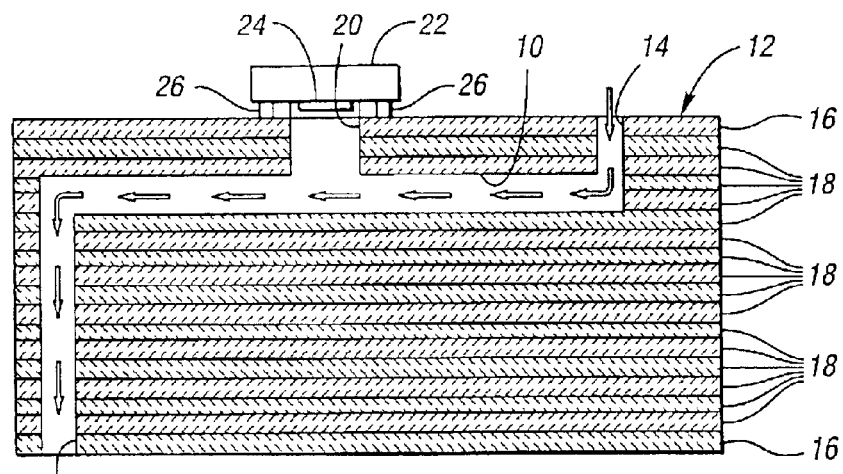
FIG. 3 is a view similar to FIG. 2 with a sensor opening and a die having sensors in fluid communication with the fluid channel.
Figure 4:
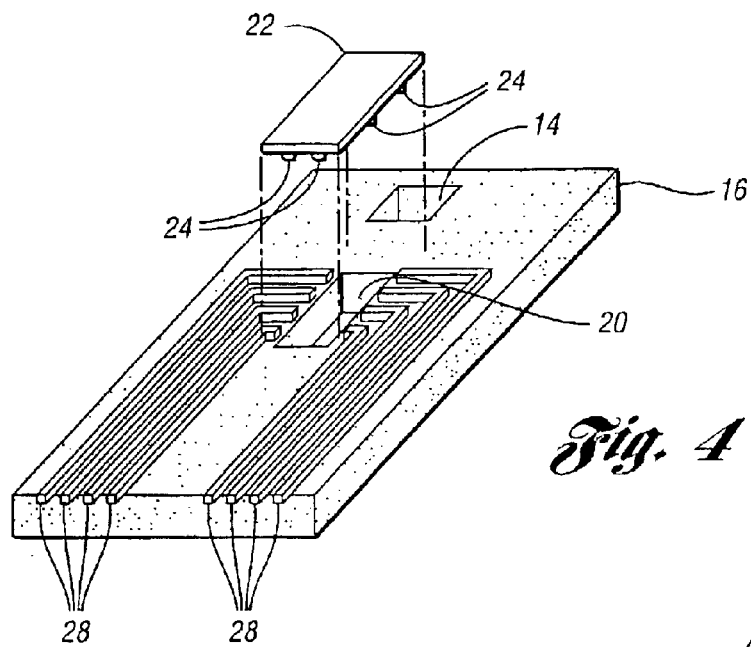
FIG. 4 is a schematic, exploded perspective view of a top outer layer of the PCB and the die and further showing the fluid entrance, the sensor opening, traces and connectors on the top surface of the outer layer.

Referring now to FIGS. 3 and 4, using the same type of material removal, a hole 20 is created in the middle of the channel 10 to allow access to the fluid. A chip or die 22 containing chemical sensors 24 is flip-chip mounted over this hole 20. During the flip-chipping process, a passivation material (underfill) is injected between the chip 22 and the board 12 which allows electrical contact between the die's pads 26 (i.e., FIG. 3) and solder-bumped PCB traces 28, but ensures that the fluid in the channel 10 does not short (i.e., seals) the electrical connections. The electrical connections may be terminated using any type of standard or specialized connector suited for PCBs.

It is to be understood that injection molded parts may be bonded to the PCB 12 to provide fluid ports and reservoirs for fluids such as calibration fluids without departing from the present invention.

As described in the above-noted papers, several researchers have presented methods of forming channels in single substrates such as glass or Si using thin-film processing techniques. Other researchers have made channels in a PCB but formed the channels using the copper traces on the board. The method of the present invention allows for complete engineering of the channel dimensions because the designer can specify how high the channel 10 should be in the Z direction by specifying how many layers 18 the channel 10 should consume. The X and Y dimensions of the channel 10 are easily defined using photolithographic or milling techniques.

In the prior art where channel definition is provided by the copper traces, height specification of the channel in the Z direction is unreliably controlled by the height of the traces. Also, the copper traces would be in contact with the fluid which may not be desirable.

Electromagnetically Actuated Pumps and Valves

Laminant PCB technology is inherently a three-dimensional process as compared to thin-film processing which has severe limitations when trying to define structures in three dimensions. Using the three dimensions provided by PCB technology allows for the incorporation of electromagnetic solenoids into the standard manufacturing methodology of PCBs.

Figure 5:
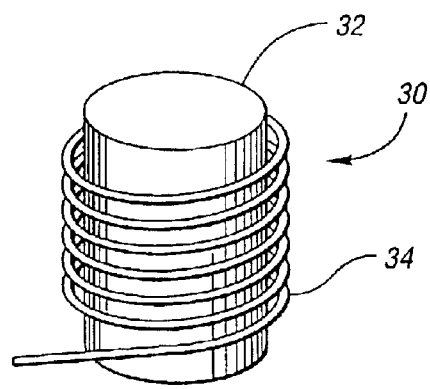
FIG. 5 is a schematic perspective view of a prior art solenoid with current flowing through a wire thereof.

A solenoid, generally indicated at 30, typically consists of a magnetic core 32 surrounded by a number of turns of a current-carrying wire 34, as shown in FIG. 5.

By forming aligned holes in the bottom inner layers 18 of the PCB 12, a cavity 36 is created to house a magnetic core 38. This core 38 may be manufactured in a number of ways including:

1) Positioning of a solid piece of a magnetic metal into the cavity 36 and attaching in place using epoxy 40 or other material;
2) Sputtering (or other deposition techniques) a magnetic metal into the cavity 36; and
3) Electroplating of a magnetic metal into the cavity 36.

Figure 6:
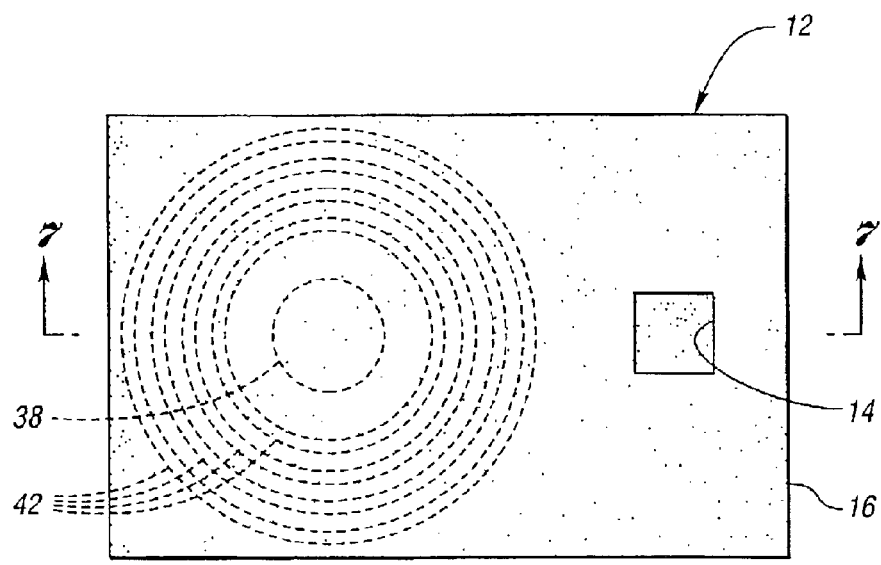
FIG. 6 is a top plan view of a solenoid and channel opening formed in inner layers of the PCB.

Using the standard through-layer-vias in PCB manufacturing and the pattern of electrical traces 42 on a given layer, the traces 42 will act as a three-dimensional wire wound around the core 38, as shown in FIGS. 6 and 7. The resulting solenoid produces an electromagnetic field. A membrane 19 is positioned in a hole 17 opened in the PCB 12 of FIG. 7 to create a pump. Multiple membranes 44 perform the actuation to create a pump, as shown in FIG. 8. A hole 46 is opened in the PCB 12 to allow each membrane 44 to make contact with the fluid in the channel 10 and each membrane 44 is used to cover its hole 46. A suitable membrane can be created in the following ways:

1) Attach a thin magnetic or metallic film to the surface of the PCB 12;
2) Embed a thin magnetic/metallic film between two of the inner layers 18 of the PCB 12;
3) Create a flexible membrane, then sputter (or otherwise deposit) metal onto the surface of the membrane; and
4) Embed metallic particles in a flexible membrane and cast the membrane over the opening 46.

By placing three of these electromagnetic actuators in succession as shown in FIG. 8, a peristaltic pump is created which drives the fluid through the channel 10. Additionally, by holding each membrane 44 in its actuated (or closed) position, the membrane 44 acts as a valve stopping fluid from flowing past it. Likewise, by holding the membrane 44 in its unactuated (or open) position, the membrane 44 allows fluid to flow past. The pump of FIG. 8 can be used in this system to deliver fluid to the sensor 24 and to help pump the fluid away from the sensor 24.

While FIG. 8 shows the membranes 44 on the upper side of the channel 10, it is to be understood that the membranes 44 could also be on the lower or solenoid side of the channel 10 to increase the amount of magnetic force that the membranes 44 experience.

Similar techniques have been employed in thin-film processed technologies on glass and silicon wafers. Additionally, several other types of actuation including thermal have been reported on PCB technology.

Figure 9:
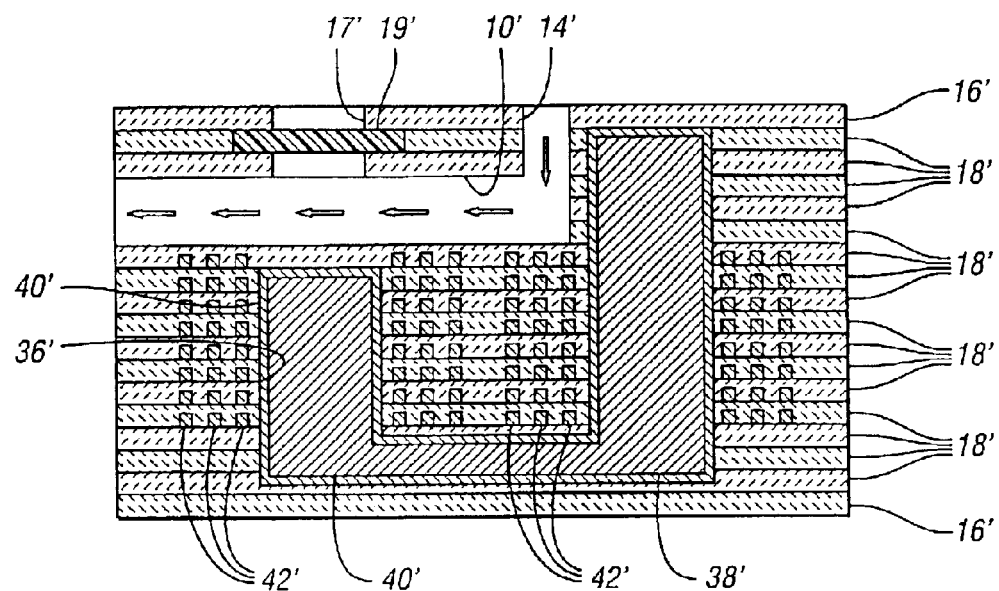
FIG. 9 is a sectional view, similar to FIG. 7, but having a solenoid with a U-shaped core.

FIG. 9 is a view similar to FIG. 7 wherein the items of FIG. 9 which perform the same or similar functions to the corresponding items of FIG. 7 have the same reference numeral but a single prime designation. A U-shaped core 38' of magnetic metal with traces 42' formed about both legs of the core 38' provide an even greater magnetic force.

Valves Using Hydrophobic Materials

A valve may be created by introducing a stretch of hydrophobic material in between two hydrophillic channels. This technique has been employed in other microfluidic systems built using thin-film processing on glass and silicon substrates. Again, however, it has not been demonstrated in laminant PCB technology where the wealth of usable materials may be able to produce a far superior microfluidic valve. Additionally, with the accurate control of all three dimensions of the channel 10 at any given point along the channel 10, this opens up the possibilities of using channel-shaping techniques to produce valves in this technology.

Figure 10:
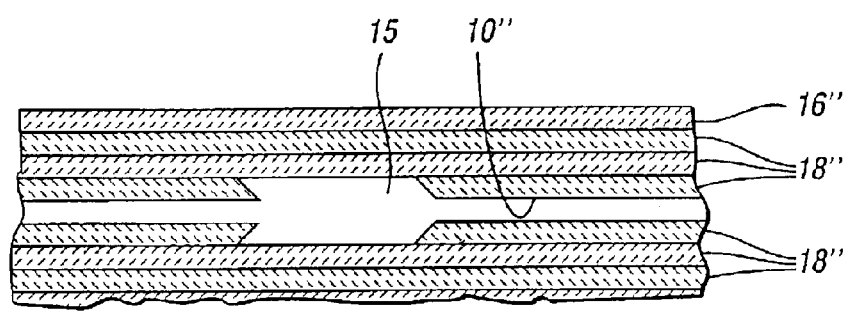
FIG. 10 is a side view, partially broken away and in cross-section, of a slope-based valve within a microchannel.

For example, FIG. 10 is a view, partially broken away and in cross-section, similar to portions of FIGS. 2, 3, 7, 8 and 9 (and, consequently, having items with a double prime designation), wherein a microchannel 10" is formed in inner layers 18" of a laminate having outer layers (one of which is shown at 16"). A pump chamber may be formed with unidirectional valves (one of which is shown in FIG. 10 at 15) on either side of the chamber. These can be made by shaping or removing a section of one or more inner layers 18".

Many of the techniques and system methodologies presented here have been implemented using thin-film processing on wafer substrates. Additionally, several forms of actuation other than electromagnetic have been implemented in PCB technology. However, the devices presented above are believed to be the first ones that use electromagnetic actuation in laminate or PCB technology to serve as stand-alone valves or to be combined and used as the peristaltic pump of FIG. 8.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A microactuated device of the sandwich type, the device comprising:
   a substrate having outer insulating layers and inner insulating layers sandwiched between the outer insulating layers;
   an electromagnetic inductor housed within the inner insulating layers between the outer insulating layers to produce a magnetic field;
   a diaphragm coupled to one of the insulating layers so that forces exerted by the magnetic field cause movement of the diaphragm;
   a fluid channel formed in at least one of the inner insulating layers;
   a sensor opening formed through a first outer insulating layer and in fluid communication with the fluid channel; and
   a microsensor supported on the first outer insulating layer over the sensor opening which fluidly communicates the microsensor with the fluid channel.

2. The device as claimed in claim 1 wherein the substrate is a laminate.

3. The device as claimed in claim 1 wherein the inductor is a solenoid.

4. The device as claimed in claim 3 wherein the solenoid includes electrically conductive traces disposed on at least one of the inner insulating layers.

5. The device as claimed in claim 4 wherein the solenoid includes electrically conductive traces disposed on a plurality of the inner insulating layers.

6. The device as claimed in claim 4 wherein the solenoid includes a magnetic core surrounded by the traces.

7. The device as claimed in claim 1 further comprising a fluid channel formed in at least one of the inner insulating layers.

8. The device as claimed in claim 1 further comprising a pump chamber formed in one of the insulating layers in fluid communication with the fluid channel wherein the diaphragm is movable between first and second operative positions to vary the volume of the pump chamber.

9. The device as claimed in claim 1 further comprising a plurality of electromagnetic inductors housed within the inner insulating layers between the outer insulating layers to produce corresponding magnetic fields, a plurality of diaphragms coupled to one of the insulating layers so that magnetic forces exerted by their respective magnetic fields causes movement of the diaphragms and wherein the device further comprises pump chambers formed in one of the insulating layers in fluid communication with the fluid channel wherein each of the diaphragms is moveable between first and second operative positions to vary the volume of its respective pump chamber.

10. The device as claimed in claim 1 further comprising a valve chamber formed in one of the insulating layers in fluid communication with the fluid channel wherein the diaphragm is movable between first and second operative positions within the valve chamber to operate as a valve.

11. The device as claimed in claim 1 further comprising a channel opening formed through a first outer insulating layers and in fluid communication with the fluid channel.

12. The device as claimed in claim 1 further comprising a plurality of separate fluid channels formed in at least one of the inner insulating layers.

13. The device as claimed in claim 1 wherein the inductor is completely housed within the inner insulating layers between the outer insulating layers.

14. A microactuated device of the sandwich type, the device comprising:
   a substrate having outer insulating layers and inner insulating layers sandwiched between the outer insulating layers;
   an electromagnetic inductor housed within the inner insulating layers between the outer insulating layers to produce a magnetic field;
   a diaphragm coupled to one of the insulating layers so that forces exerted by the magnetic field cause movement of the diaphragm; and
   a fluid channel formed in at least one of the inner insulating layers; wherein the fluid channel has different channel portions and wherein a pair of the channel portions are defined by hydrophillic material and are fluidly communicated by a channel portion defined by hydrophobic material to form a valve.

15. A sandwich type device having a microchannel formed therein, the device comprising:
   a substrate having outer insulating layers and inner insulating layers sandwiched between the outer insulating layers; and
   a microchannel formed in at least one of the inner insulating layers between the outer insulating layers;
   a sensor opening formed through a first outer insulating layer and in fluid communication with the microchannel; and
   a microsensor supported on the first outer insulating layer over the sensor opening which fluidly communicates the microsensor with the microchannel.

16. The device as claimed in claim 15 wherein the microchannel is formed in a plurality of the inner insulating layers.

17. The device as claimed in claim 15 wherein the substrate is a laminate.

18. The device as claimed in claim 15 further comprising a pump chamber formed in one of the insulating layers in fluid communication with the microchannel.

19. The device as claimed in claim 18 further comprising a plurality of pump chambers formed in one of the insulating layers in fluid communication with the microchannel.

20. The device as claimed in claim 15 further comprising a valve chamber formed in one of the insulating layers in fluid communication with the microchannel.

21. The device as claimed in claim 15 further comprising a channel opening formed through a first outer insulating layer and in fluid communication with the microchannel.

22. The device as claimed in claim 15 further comprising a plurality of separate microchannels formed in at least one of the inner insulating layers.

23. A sandwich type device having a microchannel formed therein, the device comprising:
   a substrate having outer insulating layers and inner insulating layers sandwiched between the outer insulating layers: and
   a microchannel formed in at least one of the inner insulating layers between the outer insulating layers; wherein the microchannel has different channel portions and wherein a pair of the channel portions are defined by hydrophillic material and are fluidly communicated by a channel portion defined by hydrophobic material to form a valve.

* * * * *